United States Patent

Swan

[11] 4,056,785
[45] Nov. 1, 1977

[54] LOW-NOISE MICROWAVE AMPLIFIER

[75] Inventor: Clarence Burke Swan, Allentown, Pa.

[73] Assignee: Bell Telephone Laboratories, Incorporated, Murray Hill, N.J.

[21] Appl. No.: 747,899

[22] Filed: Dec. 6, 1976

[51] Int. Cl.$^2$ .............................................. H03F 3/60
[52] U.S. Cl. ................................ 330/53; 330/124 D; 330/151
[58] Field of Search ..................... 330/53, 151, 124 D; 333/1.1

[56] References Cited

U.S. PATENT DOCUMENTS

| | | | |
|---|---|---|---|
| 3,857,106 | 12/1974 | Seidel | 330/53 |
| 3,992,669 | 11/1976 | Dades | 330/124 D X |

Primary Examiner—Lawrence J. Dahl
Attorney, Agent, or Firm—Lucian C. Canepa; Maurice de Picciotto

[57] ABSTRACT

An improved low-noise microwave amplifier comprises a circuit arrangement coupled in parallel with a GaAs FET amplifying stage for reducing transmission loss in case of dc power failure or amplifying stage failures. The circuit arrangement comprises two microwave circulators and a microwave isolator connected therebetween.

7 Claims, 2 Drawing Figures

LOW-NOISE MICROWAVE AMPLIFIER

The present invention relates to electromagnetic wave amplifiers, and more particularly to low-noise microwave amplifiers.

BACKGROUND OF THE INVENTION

A known microwave amplifier circuit is described in U.S. Pat. No. 3,857,106, issued to H. Seidel on Dec. 24, 1974 and assigned to the assignee of the present application. In accordance with this known circuit, an input signal is divided into two components by means of a quadrature hybrid coupler. The first of such components is applied, via a circulator, to the input port of a transistor amplifying stage. The second of such components is applied, via a second circulator, to the output port of the amplifying stage. A four-port reactive circuit combines the scattered waves produced at the input and output ports of the amplifying stage and delivers an amplified output signal. The availability of low-noise microwave transistors, such as gallium arsenide field effect transistors (GaAs FETs), should render possible the realization of a low-noise low distortion amplifier. The use of a single GaAs FET amplifier common to several radio channels imposes reliability requirements of substantial importance. On the one hand, failure of the amplifying transistor would cause unacceptable loss of signal for several channels. On the other hand, in case of power supply failure, the amplifying transistor would exhibit a high transmission loss resulting in a total service outage when used as a common amplifier in multichannel radio. The known arrangement described in Seidel's patent does not and cannot meet these reliability requirements by simple and economical means. Moreover, duplicating the number of amplifying stages to solve the reliability problem leads to a bulky, complex and expensive amplifier circuit.

Another known microwave amplifier arrangement is described in U.S. Pat. No. 3,789,314 issued to H. R. Beurrier on Jan. 29, 1974 and assigned to applicant's assignee. In this known arrangement, a signal source is coupled to a matching output circuit by means of two parallel connected wavepaths. One of the wavepaths is a low-loss passive wavepath, while the other wavepath includes one or more active elements. This known arrangement is primarily concerned with conserving a portion of the input signal that previously was dissipated in matching termination impedances. This known arrangement does not comply with the two reliability requirements mentioned above, i.e., acceptable output signals in the presence of either a failure of the amplifying stage or the power supply. Furthermore, a suggested coupling of two amplifying stages in parallel results in disadvantages similar to the one discussed above in connection with the Seidel arrangement.

SUMMARY OF THE INVENTION

The above problems are solved in an illustrative embodiment of the present invention wherein a microwave low-noise amplifier comprises input and output microwave circulators, each having a first, second and third port. An input signal is coupled to the first port of the circulator, and an output signal is derived from the second port of the output circulator. An amplifying stage is coupled between the second port of the input circulator and the first port of the output circulator. In accordance with the present invention, a signal by-pass arrangement is coupled between the third ports of the input and output circulators for reducing transmission loss of the amplifier under unpowered or failed condition of the amplifying stage.

In a preferred embodiment of the present invention, the signal by-pass arrangement comprises a passive nonreciprocal device for preventing output signals from being fed back to the input portion of the amplifier. The nonreciprocal device may be a microwave isolator comprising for example a microwave circulator properly terminated at one of its ports. In such a preferred embodiment, the amplifying stage is a single-ended low-noise amplifier using a GaAs FET or similar transistor.

In accordance with another embodiment of the invention, a filter and/or a path length adjustment circuit is inserted in the by-pass arrangement, in series with the nonreciprocal device, for further adjusting the phase of any input signal reflected at the input port of the amplifying stage prior to coupling such a reflected signal to the output circulator.

One object of the present invention is to reduce transmission loss of a low-noise microwave amplifier in the unpowered or failed condition.

Another object of the present invention is to utilize the low input and output unpowered return losses peculiar to a FET for reducing the transmission loss of low-noise microwave amplifiers in the unpowered or failed condition.

A further object of the present invention is to achieve good input and output matches regardless of the input and output match of the amplifying stage under both normal and emergency conditions.

A still further object of the present invention is to realize a simple, compact and economical low-noise microwave amplifier without requiring a balanced amplifier configuration.

These and other objects and advantages of this invention will appear more fully upon consideration of the various illustrative embodiments now to be described in detail in connection with the accompanying drawings.

DETAILED DESCRIPTION OF THE DRAWINGS

Figure 1:
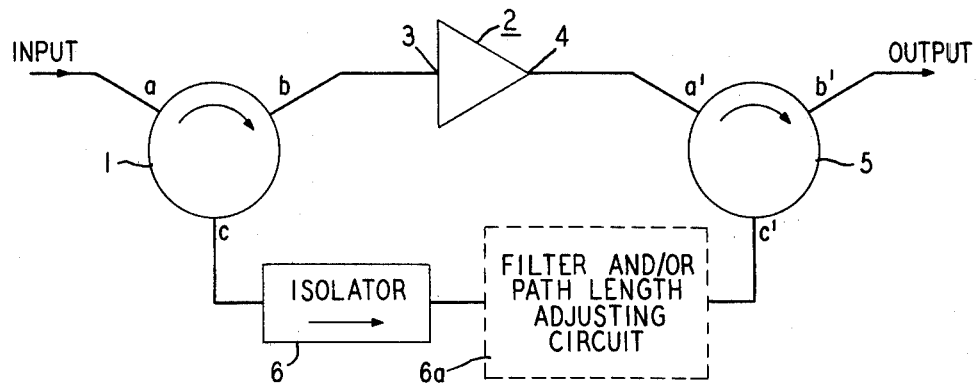
FIG. 1 is a block diagram of a low-noise microwave amplifier in accordance with the present invention.

Referring now to the drawings, FIG. 1 schematically shows a block diagram of an illustrative embodiment of a low-noise microwave amplifier according to the present invention. The amplifier comprises an input circulator 1 having first, second and third ports $a$, $b$ and $c$, respectively. An input signal coupled to port $a$ will appear at port $b$ according to known circulation theories. Port $b$ of circulator 1 is coupled to the input terminal 3 of an amplifying stage 2. The output terminal 4 of amplifying stage 2 is coupled to the first port $a'$ of output circulator 5. An output signal is derived from the output circulator second port $b'$. Thus, an input signal applied at port $a$ will be amplified by stage 2 and delivered at port $b'$ of output circulator 5. In conventional microwave amplifier circuits, a loss of dc power in the amplifying stage 2 or a failure of the active elements in such a stage would result in a substantial transmission loss. In order to reduce such loss to a value lower than 10 dB, a signal by-pass arrangement in accordance with the present invention is provided between the third ports $c$ and $c'$ of input and output circulators 1 and 5, respectively.

As shown in FIG. 1, an illustrative embodiment of such a by-pass arrangement comprises a microwave nonreciprocal device, e.g., a standard microwave isolator 6. The latter is coupled such that only signals from input circulator 1 are fed to the third port $c'$ of output circulator 5. The direction of the arrow in isolator 6 indicates the direction of such coupling. In the illustrative embodiment of the invention, amplifying stage 2 comprises a single-ended low-noise amplifier using GaAs FETs or similar microwave active devices. An unpowered state may result from either a failure of the dc power supply of amplifying stage 2, or a failure of the active devices in such stage. In the unpowered or failed state, the input return loss of a low-noise GaAs FET amplifier has been found to be as low as 1 to 3 dB. Thus, if an input signal is applied at port $a$ of circulator 1, this signal will be transmitted by port $b$ to the input terminal 3 of the amplifying stage. However, since such amplifying stage is in an unpowered state, the input signal will be reflected at 3 and directed back to port $b$ of circulator 1. Due to the rotational action of circulator 1, this reflected signal will appear at port $c$ and be coupled to port $c'$ of circulator 5 via isolator 6. In view of the rotational effect of circulator 5, the signal in the by-pass arrangement will be directed from port $a'$ to the output terminal 4 of amplifying stage 2. The output return loss of a low-noise GaAs FET has also been found to be as low as 1 to 3 dB in the unpowered or failed state. Therefore, the major portion of the by-pass signal is reflected at 4 and directed to port $a'$ of circulator 5. This output reflected signal will thus appear at output port $b'$ of circulator 5.

In the just-described arrangement, the total transmission loss due to all effects resulting from failures, has been reduced from typically 20 dB to about 3 to 8 dB. In radio and communication systems where a low-noise amplifier is to be used in common for several channels, a loss of the order of 3 to 8 dB is sufficiently small to still provide uninterrupted service during an emergency.

In addition to providing an emergency signal path, the input and output circulators 1 and 5 of FIG. 1 can assure good input and output matches to respective associated input and output circuitry (not shown) regardless of the input and output match of the amplifying stage for both the normal and emergency states.

The illustrative embodiment of FIG. 1 includes only one transistor, and eliminates the need of using prior art hybrid couplers which require accurate and exacting processing for holding dimensional tolerances. In accordance with the present invention, substantial economies in size, complexity and cost are achieved by using a single transistor approach. Other standard circuit elements, such as a filter and/or a path length adjusting device 6a, can be inserted in the by-pass arrangement for modifying the phase of the signals delivered to port $c'$ of output circulator 5.

Figure 2:
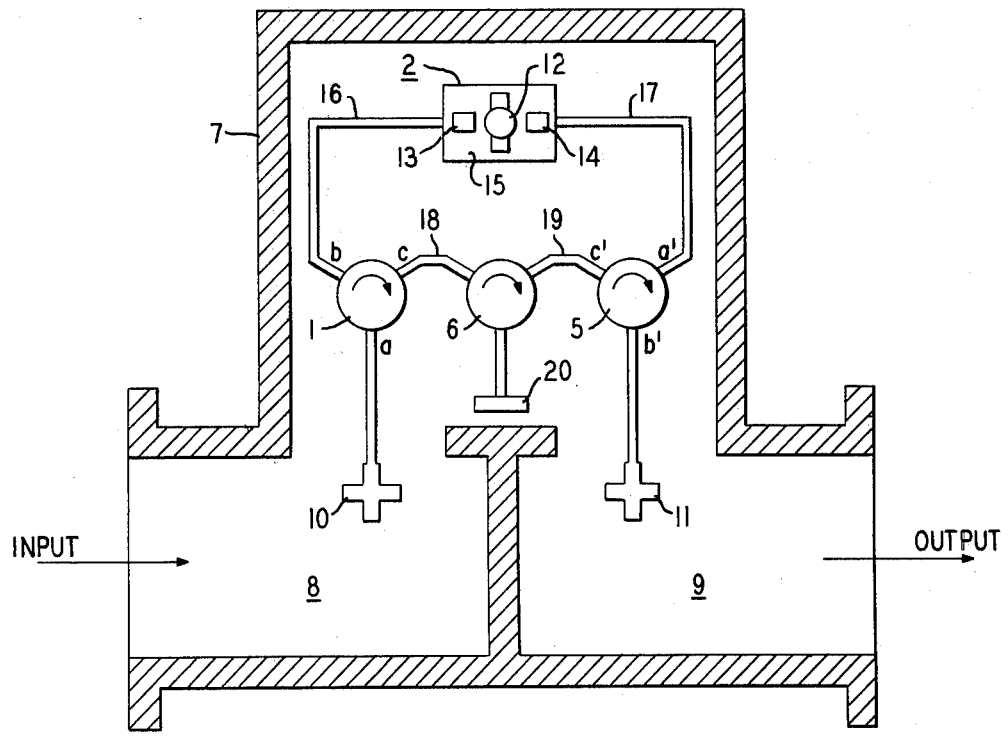
FIG. 2 shows a cross section of an illustrative embodiment of the present invention utilizing microwave integrated circuit (MIC) technology.

One specific illustrative realization in MIC form of a low-noise microwave amplifier according to the invention is shown in FIG. 2 wherein various elements have the same reference numerals as in FIG. 1. The low-noise amplifier is mounted in a metallic housing 7 having a waveguide input section 8 and a waveguide output section 9. Input and output circulators 1 and 5 comprise air-stripline circulators coupled to the input and output waveguide sections 8 and 9 by means of standard waveguide-to-stripline transition elements 10 and 11. The amplifying stage 2 comprises a single GaAs FET 12, along with two conventional alumina ceramic microstrip input and output matching circuits 13 and 14. The GaAs FET 12 and the two matching circuits 13 and 14 are mounted on a metal carrier plate 15 which is insulated from the housing by means of a thin sheet of dielectric material. The latter may be, for example, a 3 mil thick sheet of commercially available polyimide for providing a floating ground plane thereby permitting operation of the amplifier from available power sources at a radio bay. The input and output circulators 1 and 5 are coupled to the amplifying stage 2 by means of stripline sections 16 and 17, respectively.

As suggested above, isolator 6 in FIG. 2 is illustratively a three-port microwave circulator having a first port coupled to input circulator 1 by means of stripline section 18, and a second port coupled to output circulator 5 by means of stripline section 19. The third port of circulator 6 is coupled to a matching impedance 20 such that only signals in the direction from circulator 1 to circulator 5 will pass through circulator 6. Each of the three circulators is preferably realized in air-dielectric-stripline form using a pair of commercially available ferrite discs at each circulator junction.

The present invention has been described with reference to a particular embodiment. It is to be understood, however, that the described embodiment is merely illustrative of the principles and applications of the invention. Numerous modifications may be made by those skilled in the art without departing from the spirit and scope of the invention. For example, other microwave coupling devices, such as conventional 3 dB couplers, can be substituted for output circulator 5. In addition, the MIC structure of FIG. 2 can be modified to include a filter and/or a path length adjusting device in series with microwave circulator 6.

What is claimed is:

1. A microwave amplifier comprising:
an input microwave circulator having in the direction of circulation a first, second and third port;
an output microwave coupling device having at least a first, second and third port;
means for coupling an input signal to the first port of said input circulator;
means for deriving an output signal from the second port of said output device;
an amplifying stage having an input terminal and an output terminal;
means for coupling said amplifying stage between the second port of said input circulator and the first port of said output device; and
a passive signal by-pass arrangement coupled between the third ports of said input circulator and output device such that only under unpowered or otherwise failed condition of said amplifying stage said input signal is reflected at said input terminal and coupled to said output terminal via said input circulator, said passive by-pass arrangement and said output coupling device thereby reducing transmission loss of the amplifier.

2. A microwave amplifier comprising:
input and output microwave circulators, each having in the direction of circulation a first, second and third port;

means for coupling an input signal to the first port of said input circulator;

means for deriving an output signal from the second port of said output circulator;

an amplifying stage having an input terminal and an output terminal;

means for coupling said amplifying stage between the second port of said input circulator and the first port of said output circulator; and a passive signal by-pass arrangement coupled between the third ports of said input and output circulators such that only under unpowered or otherwise failed condition of said amplifying stage said input signal is reflected at said input terminal and coupled to said output terminal via said input circulator, said passive by-pass arrangement and said output circulator thereby reducing transmission loss of the amplifier.

3. A microwave amplifier according to claim 2 wherein said signal by-pass arrangement comprises a microwave nonreciprocal device.

4. A microwave amplifier according to claim 3 wherein said nonreciprocal device comprises a three-port circulator having its first port coupled to said third port of the input circulator, its second port coupled to said third port of the output circulator and its third port coupled to a termination impedance.

5. A microwave amplifier according to claim 3 wherein said signal by-pass arrangement further comprises filtering and/or length adjusting means for modifying the phase of the by-pass signals.

6. A low-noise microwave amplifier comprising:

input and output microwave circulators, each having in the direction of circulation a first, second and third port;

means for coupling an input signal to the first port of said input circulator;

means for deriving an output signal from the second port of said output circulator;

means for coupling a GaAs FET amplifying device between the second port of said input circulator and the first port of said output circulator; and a passive signal by-pass arrangement coupled between the third ports of said input and output circulators for reducing transmission loss of the amplifier only under unpowered or otherwise failed condition of said amplifying device.

7. A low-noise microwave amplifier according to claim 6 wherein said by-pass arrangement comprises a microwave isolator for unidirectionally coupling input signals reflected at the device input terminal to the device output terminal via said output circulator.

* * * * *